United States Patent
Pikus

(10) Patent No.: US 11,275,884 B2
(45) Date of Patent: Mar. 15, 2022

(54) SYSTEMS AND METHODS FOR PHOTOLITHOGRAPHIC DESIGN

(71) Applicant: Siemens Industry Software Inc., Plano, TX (US)

(72) Inventor: Fedor G. Pikus, Beaverton, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/003,193

(22) Filed: Aug. 26, 2020

(65) Prior Publication Data

US 2020/0387661 A1    Dec. 10, 2020

Related U.S. Application Data

(62) Division of application No. 15/958,420, filed on Apr. 20, 2018, now Pat. No. 10,789,408.

(51) Int. Cl.
| | |
|---|---|
| *G06F 30/34* | (2020.01) |
| *G06F 30/398* | (2020.01) |
| *G06F 30/327* | (2020.01) |
| *G06F 30/392* | (2020.01) |
| *G06F 30/394* | (2020.01) |

(52) U.S. Cl.
CPC .......... *G06F 30/398* (2020.01); *G06F 30/327* (2020.01); *G06F 30/34* (2020.01); *G06F 30/392* (2020.01); *G06F 30/394* (2020.01)

(58) Field of Classification Search
CPC ........ G06F 30/39; G06F 30/00; G06F 30/398; G06F 30/30; G06F 30/392; G06F 2119/12; G06F 30/327; G06F 30/396; G06F 2111/04; G06F 2119/18; G06F 30/18; G06F 30/3323; G06F 2111/02; G06F 30/20; G06F 30/33; G06F 30/367; G03F 1/84; G03F 1/36; G03F 7/70441; G06T 7/0006; G06T 2207/30148; G05B 23/0294; G05B 19/4093; H01L 21/67005
USPC .................................................. 716/118–125
See application file for complete search history.

(56) References Cited

U.S. PATENT DOCUMENTS

| 7,657,856 | B1 * | 2/2010 | Koshy | .................... | G06F 30/398 716/124 |
|---|---|---|---|---|---|
| 8,448,096 | B1 * | 5/2013 | Wang | ...................... | G06F 30/39 716/52 |
| 2007/0240088 | A1 * | 10/2007 | Tang | .................... | G06F 30/3323 716/122 |
| 2014/0189616 | A1 * | 7/2014 | Rieger | .................... | G06F 30/39 716/55 |

* cited by examiner

*Primary Examiner* — Binh C Tat

(57) ABSTRACT

A method of identifying elements in a design layout having multiple levels of hierarchical cells, each cell having one or more geometric elements, may include selecting a cell from a list of candidate cells for a level of a hierarchy; applying a local rule to the selected cell; identifying each selected cell that includes a geometric element that passes the local rule; building a list of candidate cells for a next-higher level of the hierarchy according to the identified cells; repeating the selecting, identifying, and building operations for each higher level of the hierarchy; and when a highest level of the hierarchy has been processed, returning and storing the list of candidate cells as the global solution for the applied local rule.

9 Claims, 7 Drawing Sheets

SYSTEMS AND METHODS FOR PHOTOLITHOGRAPHIC DESIGN

CROSS-REFERENCE TO RELATED APPLICATION

This application is a divisional of U.S. patent application Ser. No. 15/958,420, titled "Systems and Methods for Photolithographic Design" and filed on Apr. 20, 2018, which is incorporated by reference herein in its entirety.

TECHNICAL FIELD

The disclosed technology is directed techniques for semiconductor design, including decomposition schemes and constraints for patterning clusters in a multiple-patterning scheme for layout design data, and identification of elements in the layout design data.

BACKGROUND

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows. Initially, the specification for the new microcircuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, channels, gates, etc.) making up the circuit. While the geometric elements are typically polygons, other shapes, such as circular and elliptical shapes, may be employed. These geometric elements may be custom designed, selected from a library of previously-created designs, or some combination of both. Geometric elements also are added to form the connection lines that will interconnect these circuit devices. Layout tools (often referred to as "place and route" tools), such as IC Station available from Mentor Graphics® Corporation of Wilsonville, Oreg. or Virtuoso available from Cadence® Design Systems of San Jose, Calif., are commonly used for both of these tasks.

With a layout design, each physical layer of the microcircuit will have a corresponding layer representation in the layout design data, and the geometric elements described in a layer representation will define the relative locations of the circuit device components that will make up a circuit device. Thus, the geometric elements in the representation of an implant layer will define the regions where doping will occur, while the geometric elements in the representation of a metal layer may define the locations in a metal layer where conductive wires will be formed to connect the circuit devices. Typically, a designer will perform a number of analyses on the layout design. For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, etc. This analysis is sometimes referred to as "physical verification."

After the layout design has been finalized, then it is converted into a format that can be employed by a mask or reticle writing tool to create a mask or reticle for use in a photolithographic manufacturing process. Masks and reticles are typically made using tools that expose a blank reticle to an electron or laser beam. Most mask writing tools are able to only "write" certain kinds of polygons, however, such as right triangles, rectangles or other trapezoids. Moreover, the sizes of the polygons are limited physically by the maximum beam aperture size available to the tool. Accordingly, larger geometric elements in the layout design, or geometric elements that are not basic right triangles, rectangles or trapezoids (which typically is a majority of the geometric elements in a layout design) must be "fractured" into the smaller, more basic polygons that can be written by the mask or reticle writing tool.

Once the layout design has been fractured, then the layout design data can be converted to a format compatible with the mask or reticle writing tool. Examples of such formats are MEBES, for raster scanning machines manufactured by ETEC, an Applied Materials Company, the ".MIC" format from Micronics AB in Sweden, and various vector scan formats for Nuflare, JEOL, and Hitachi machines, such as VSB12 or VSB12. The written masks or reticles can then be used in a photolithographic process to expose selected areas of a wafer in order to produce the desired integrated circuit devices on the wafer.

To meet the demand for more powerful microdevices, designers have regularly increased the average density of their structures. For example, the area of an integrated circuit that might once have contained 100 transistors may now be required to contain 1,000 or even 10,000 transistors. Some current microdevice designs call for microdevice structures to be packed so closely that it may be difficult to properly manufacture adjacent structures in a single lithographic process. For example, a current microcircuit design may specify a series of parallel conductive lines positioned so closely that a conventional mask writer cannot resolve the pitch between the lines.

To address this issue, the structures in a layer of a microcircuit device are now sometimes formed using two or more separate lithographic processes. This technique, referred to as "multiple patterning," partitions, or decomposes, a layout design into two or more groups or "colors," each of which is then used to form a complementary lithographic mask pattern. Thus, if a layout design calls for a series of closely-spaced parallel connective lines, this target pattern may be partitioned so that adjacent lines are actually formed by different masks in separate lithographic processes.

While double patterning lithographic techniques allow for denser microdevice structures, it is sometimes difficult to implement these techniques. For example, it may difficult to determine when the geometric elements described in layout design data (corresponding to the physical structures of the microdevice) can be correctly partitioned into two complementary sets of layout design data without creating a conflict (i.e., a situation where two or more adjacent geometric elements are too close to be formed by the same lithographic mask, but are nonetheless scheduled to be formed by the same lithographic mask).

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
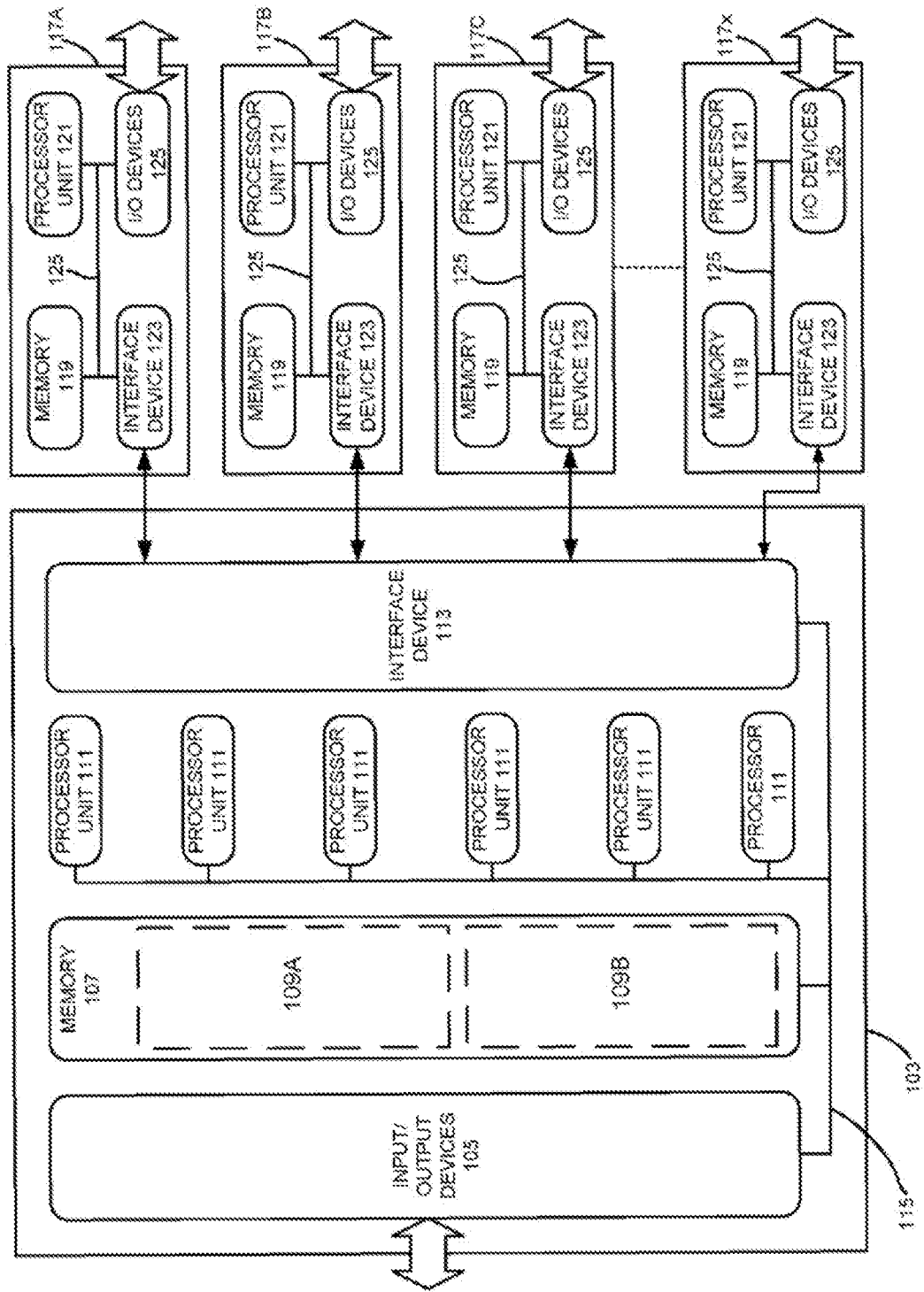
FIGS. 1 and 2 illustrate components of a computer system that may be used to implement various embodiments of the disclosed technology.

It may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Illustrative Operating Environment

The execution of various electronic design automation processes described herein may be implemented using computer-executable software instructions executed by one or more programmable computing devices. Because these processes may be implemented using software instructions, the components and operation of a generic programmable computer system on which various embodiments of these processes may be employed will first be described. Further, because of the complexity of some electronic design automation processes and the large size of many circuit designs, various electronic design automation tools are configured to operate on a computing system capable of simultaneously running multiple processing threads. The components and operation of a computer system having a host or master computer and one or more remote or slave computers therefore will be described with reference to FIG. 1. This operating environment is only one example of a suitable operating environment, however, and is not intended to suggest any limitation as to the scope of use or functionality of any implementations of the invention.

In FIG. 1, the computer system 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other non-transitory storage medium that can be used to store desired information. As used herein, the term "non-transitory" refers to the ability to store information for subsequent retrieval at a desired time, as opposed to propagating electromagnetic signals.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon® microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
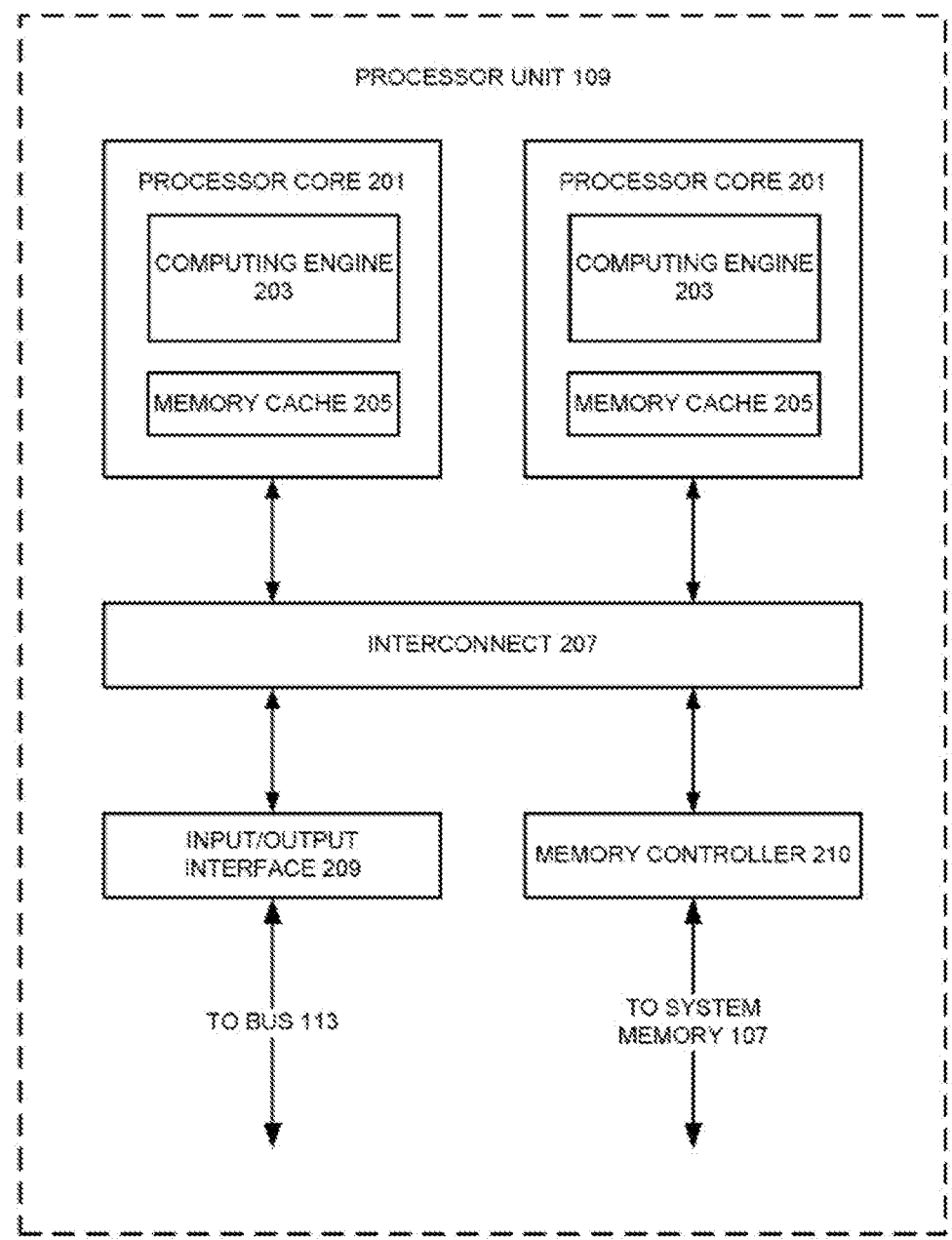

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, an alternate implementation of the computing system 101 may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 1157, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the technology may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the computer system 101, the master computer 103 may be connected to one or more external data storage devices. These external data storage devices may be implemented using any combination of non-transitory computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the computer system 101, one or more of the slave computers 117 may alternately or additions be connected to one or more external non-transitory data storage devices. Typically, these external non-transitory data storage devices will include data storage devices that also are connected to the master computer 103, but they also may be different from any data storage devices accessible by the master computer 103.

It also should be appreciated that the description of the computer system 101 illustrated in FIG. 1 and FIG. 2 is provided as an example only, and it not intended to suggest any limitation as to the scope of use or functionality of various embodiments of the invention.

Organization of Layout Design Data

As used herein, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually in the design, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells. Of course, while the above-described example is of design data organized hierarchically based upon circuit structures, circuit design data may alternately or additionally be organized hierarchically according to any desired criteria including, for example, a geographic grid of regular or arbitrary dimensions (e.g., windows), a memory amount available for performing operations on the design data, design element density, etc.

Double and Multiple Patterning

Because of the structural density of conventional integrated circuits, a single physical layer of an integrated circuit device is now sometimes formed using two or more separate masks during a lithographic manufacturing process. For example, the geometric elements in layout design data representing a physical layer of an integrated circuit may be partitioned into two or more groups or "colors," each of which is then used to form a complementary lithographic mask. Thus, if a layout design calls for a series of closely-spaced parallel connective lines, this target pattern may be partitioned so that adjacent lines are actually formed by different masks in separate lithographic processes. This technique is referred to as "double patterning." Similarly, techniques that divide a physical layer into three sets of geometric elements, each of which is then used to form a complementary lithographic mask pattern, is referred to a "triple patterning." In general, the use two, three, four, or even more complementary masks (and complementary sets of geometric elements) are sometimes commonly referred to as multiple patterning.

Figure 3A:
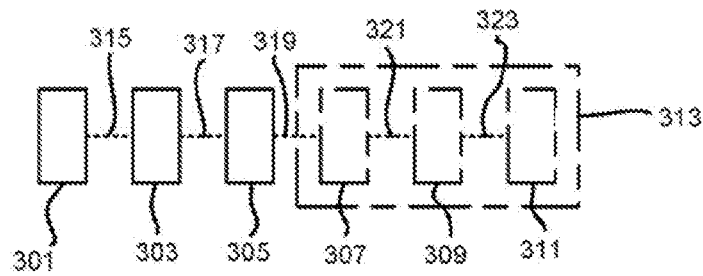
FIGS. 3A-3C illustrate the use of constraints to determine respective placement of geometric elements for complementary using a double-patterning technique in accordance with disclosed embodiments.
Figure 3B:
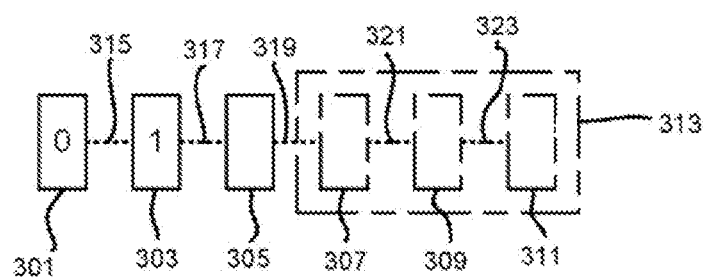

For example, FIG. 3A illustrates geometric elements 301-311, of which geometric elements 307-311 are placed within a hierarchical cell 313. In this example, the geometric elements are placed with constraints (sometimes referred to as a "separation directives") that direct geometric elements placed too closely to each other to be assigned to different lithographic masks. For example, the mask assignments of polygons 301 and 303 are controlled by a constraint 315. The constraint 315 requires that, if geometric element 301 is assigned to one mask (for example, "colored" with a value of "0"), then geometric element 303 should be assigned to another mask (for example, "colored" with a value of "1"), as shown in FIG. 3B. With various implementations of this technology, the color of a geometric element can be designated by a variety of techniques. For example, with double-patterning, a single bit associated with a geometric element can be used to designate that geometric element as being colored "0" or being colored "1."

Figure 3C:
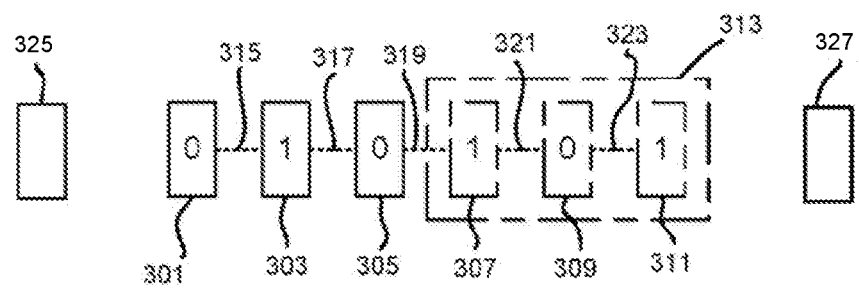

Likewise, the mask assignments of polygons 303 and 305 are controlled by a constraint 317. The constraint 317 requires that, if geometric element 303 is assigned to one mask (for example, "colored" with a value of "1", as previously noted), then geometric element 305 should be assigned to another mask (for example, "colored" with a value of "0"), as shown in FIG. 3C. Constraints 319-323 then direct the mask assignments of polygons 307-311, respectively, as shown in FIG. 3C. As seen in this figure, while geometric elements 307-311 are contained within a cell that may have many placements throughout a layout design, the mask assignment or "coloring" of these geometric elements are constrained by the local placement of geometric elements outside of the cell. Further, as seen from FIGS. 3A-3C, the geometric elements 301-311 may be seen as being "interconnected" by their constraints 315-323. A set of geometric elements interconnected by coloring constraints will be referred to herein as a patterning cluster. Geometric elements 325 and 327, shown in FIG. 3C, have no constraint relationship with any of geometric elements 307-311, and thus are not part of the patterning cluster formed by geometric elements 301-311.

Figure 4:
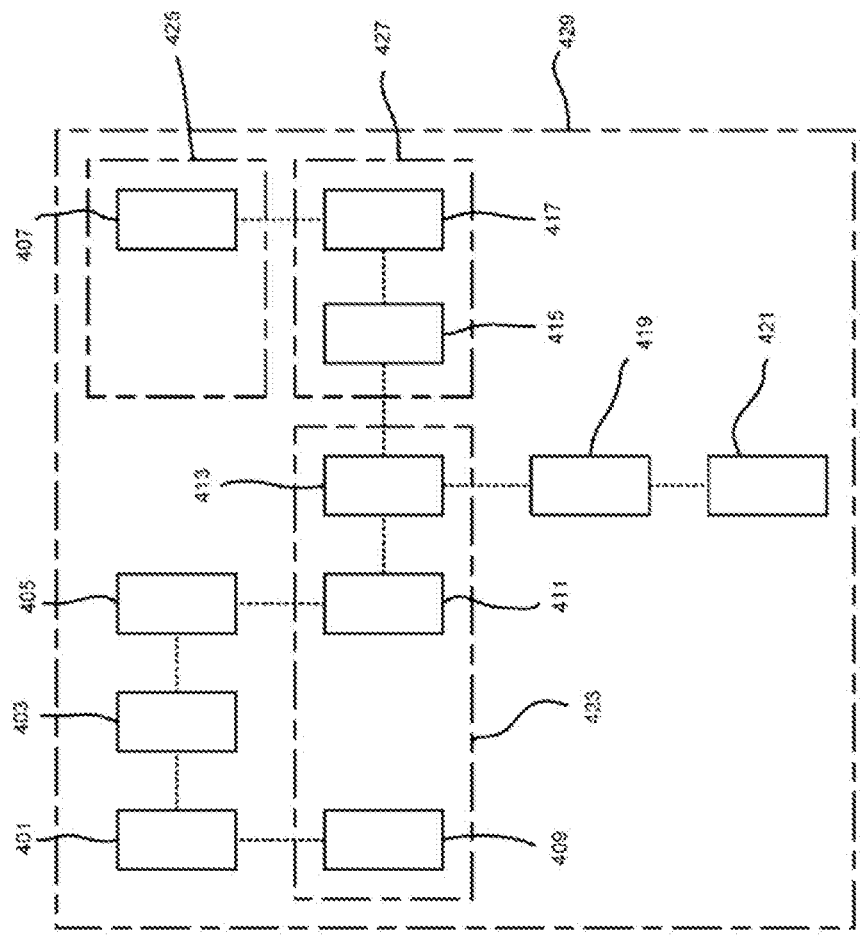
FIG. 4 illustrates an example of a patterning cluster that extends through multiple hierarchical cells in accordance with disclosed embodiments.

FIG. 4 illustrates an example of a patterning cluster that extends through multiple hierarchical cells. More particularly, this figure shows geometric elements 401-421. Of these, geometric element 407 is placed in hierarchical cell 425, geometric elements 409-413 are placed in hierarchical cell 423, and geometric elements 415 and 417 are placed in hierarchical cell 427. All of the geometric elements 401-421 (and the hierarchical cells 423-427) are placed within the higher level hierarchical cell 429. As seen in this figure, all of the geometric elements 401-421 are associated together, either directly or indirectly, by constraints (shown in FIG. 4 by dotted lines) into a single patterning cluster. Within hierarchical cell 423, however, geometric elements 411 and 413 are directly associated by a constraint, but neither of geometric elements 411 and 413 is associated with geometric element 409 by a constraint within the cell. Thus, when considering hierarchical cell 409 by itself, it appears to contain two patterning clusters: a first cluster made up of geometric element 409 alone, and a second cluster made up of geometric elements 411 and 413. As discussed herein, this type of partial patterning cluster, which appears to be an isolated cluster when viewed within a single hierarchical cell, but which is part of a larger cluster when considered within a higher hierarchical cell, will be referred to as a patterning cluster portion. Thus, hierarchical cell 423 includes two patterning cluster portions (made up of geometric element 409 and geometric elements 411 and 413), hierarchical cell 425 includes a single patterning cluster portion made up of geometric element 407, and hierarchical cell 427 includes a single patterning cluster portion made up of geometric elements 415 and 417. The higher-level hierarchical cell 429 then includes the entire patterning cluster.

FIG. 4 also illustrates that a layer of a design includes geometric elements in a two-dimensional layout. A computer system implementing a design tool or constraint generator recognizes the relative positions of each geometric element in the layer, and, for a given orientation, that various geometric elements are above, below, to the left or right, symmetric to, aligned with, or otherwise arranged in the layout with respect to each other. In various embodiments described below, the computer system can identify geometric elements or clusters by relation to each other. For example, the computer system can recognize that geometric element 405 is "above" geometric element 411 and that geometric element 413 is to the right of geometric element 411. The "knowledge" of relative positions is useful in cases, for example, where the lower-left geometric element is the "anchor" element of the design and should be "colored" to be assigned to a specific lithographic mask.

Also, while various operations have been described above with respect to double patterning, it should be appreciated that these operations also can be applied to triple patterning and higher multiple patterning alternatives. For example, with a triple patterning technique, after determining the color values of the sampling markers for a second coloring arrangement, the computer system will determine the color values of the sampling markers for a third coloring arrangement different from the first and second coloring arrangements.

Figure 5:
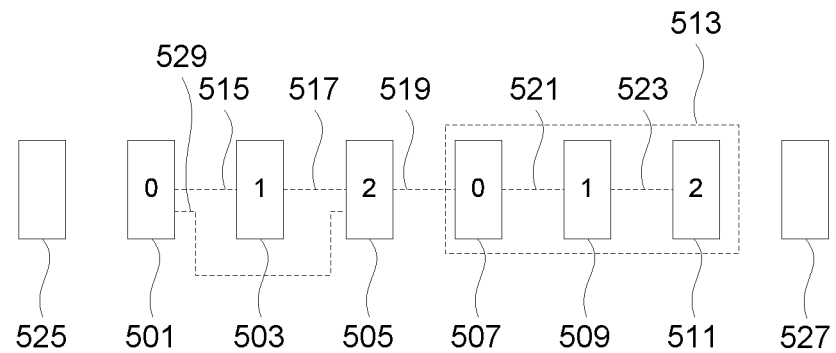
FIG. 5 illustrates triple patterning in accordance with disclosed embodiments.

For example, FIG. 5 illustrates triple patterning in accordance with disclosed embodiments. This figure shows geometric elements 501-511, of which geometric elements 507-511 are placed within a hierarchical cell 513. In this example, the geometric elements are placed with constraints 515-523 that direct geometric elements placed too closely to each other to be assigned to different lithographic masks. For example, the mask assignments of polygons 501 and 503 are controlled by a constraint 515. The constraint 515 requires that, if geometric element 501 is assigned to one mask (for example, "colored" with a value of "0"), then geometric element 503 should be assigned to another mask (for example, "colored" with a value of "1"). Similarly, constraint 517 requires that geometric element 503 be assigned a different mask (in this case, "colored" with the value of "1") than geometric element 505 (in this example, "colored" with a value of "2"). In this example, elements 525 and 527 have no constraints.

In a triple-patterning example such as this, it may be seen that a further constraint 529 can be defined to require that geometric element 501 is assigned a mask (color "0") that is different than geometric element 505 (color "2"). In a triple-patterning case, in a chain of geometric elements interconnected by constraints between neighboring elements, additional constraints between each geometric element and its second-neighbor elements (that is, two elements away in the chain) result in a coloring pattern as shown, with a strict rotation between each mask assignment (in this example, 0-1-2-0-1-2).

Constraints such as those describe herein cannot, in any practical sense, be manually defined between the thousands or even millions of geometric elements. In conventional systems, constraints such as these are generated by a constraint generator application that automatically generates constraints based on the distance between two geometric elements as applied to some threshold distance. A problem with such a conventional constraint generator, and the computer system that implements the constraint generator, is that these distance-only, automatically generated constraints cannot account for more sophisticated rules for constraint generation, such as when a designer wants certain geometric elements, such as symmetric polygons, on the same mask. Similarly, the conventional constraint generator cannot effectively generate the second-neighbor constraints discussed above, since if the distance threshold is increased to cause automatic generation of constraints between second-neighbor polygons, then the threshold is typically large enough to generate unnecessary, unwanted, and sometimes unsatisfiable constraints. There is no way, in conventional systems, to account for more sophisticated constraint generation where a simple distance threshold is insufficient to provide the desired result.

Constraint Generation Tool

Figure 6:
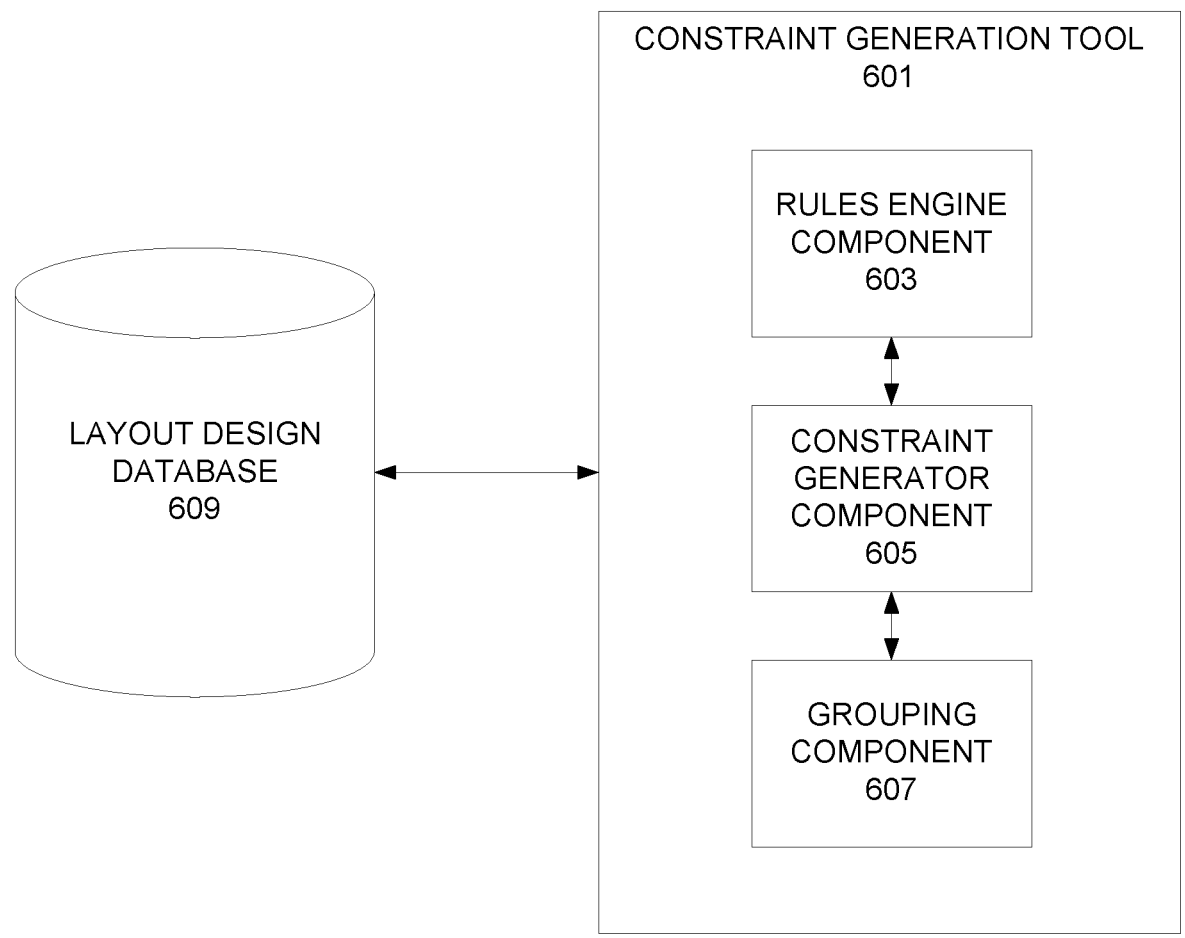
FIG. 6 illustrates an example of a coloring constraint generation tool that may be employed to select coloring arrangements in a layout design in accordance with disclosed embodiments.

FIG. 6 illustrates an example of a coloring constraint generation tool 601 that may be employed to select coloring arrangements in a layout design. As seen in this figure, the coloring selection tool 601 includes rules engine component 603, a constraint generator component 605, and a grouping component 607. As will be explained in more detail below, the rules engine component 603 manages and stores rules for constraint generation, and can interact with a user interface to receive constraint rules from a user. The constraint generator component 605 applies rules from the rules engine component 603 to generate constraints between geometric elements, clusters, and groups. The grouping component 607 defines groups of geometric elements, clusters, and other groups based on constraints.

Various examples of the rules engine component 603, constraint generator component 605, and grouping component 607 may be embodied by a single or multiprocessor computing system, such as the computing system 101 illustrated in FIG. 1. Accordingly, one or more elements of each of the rules engine component 603, constraint generator component 605, and grouping component 607 may be embodied using one or more processors in a multiprocessor computing system's master computer, such as the master computer 103, one or more servant computers in a multiprocessor computing system, such as the servant computers 117, or some combination of both executing the appropriate software instructions. Of course, some examples of the constraint generation tool 601 may be implemented by, for example, one or more computer-readable devices having such software instructions stored thereon in a non-transitory manner, that is, stored over a period of time such that they may be retrieved for use at any arbitrary point during that period of time. It also should be appreciated that, while rules engine component 603, constraint generator component 605, and grouping component 607 are shown as separate units in FIG. 6, a single servant computer (or a single processor within a master computer) may be used to embody two or all three of these components at different times, or aspects of two or three of these components at different times.

Still further, various examples of the rules engine component 603, constraint generator component 605, and grouping component 607 may be embodied by a hardware device, such as a field programmable gate array (FPGA) system configured to implement the functionality of the constraint generation tool 601. As will be appreciated by those of ordinary skill in the art, conventional field programmable gate arrays contain memory and programmable logic blocks that can be configured to operate as simple logic gates (such as AND and XOR gates) or to perform more complex combinational functions. Field programmable gate arrays also contain a hierarchy of reconfigurable interconnects that allow the blocks to be wired together in different configurations. Thus, some examples of the constraint generation tool 601 may be embodied by using field programmable gate arrays configured to have combinatorial logic circuits that perform the functionality of the rules engine component 603, constraint generator component 605, or grouping component 607 as described in more detail below. Still further, some examples of the rules engine component 603, constraint generator component 605, and grouping component 607, or some combination thereof may be embodied by an application-specific integrated circuit (ASIC) configured to perform aspects of the functionality of those tools.

The layout design database 609 may be implemented using any non-transitory storage device operable with the constraint generation tool 601. For example, the layout design database 609 may be implemented by microcircuit memory devices, such as read-write memory (RAM), read-only memory (ROM), electronically erasable and programmable read-only memory (EEPROM) or flash memory microcircuit devices, CD-ROM disks, digital video disks (DVD), or other optical storage devices. The layout design database 609 may also be implemented by magnetic cassettes, magnetic tapes, magnetic disks or other magnetic storage devices, punched media, holographic storage devices, or any combination of the foregoing devices.

Figure 7:
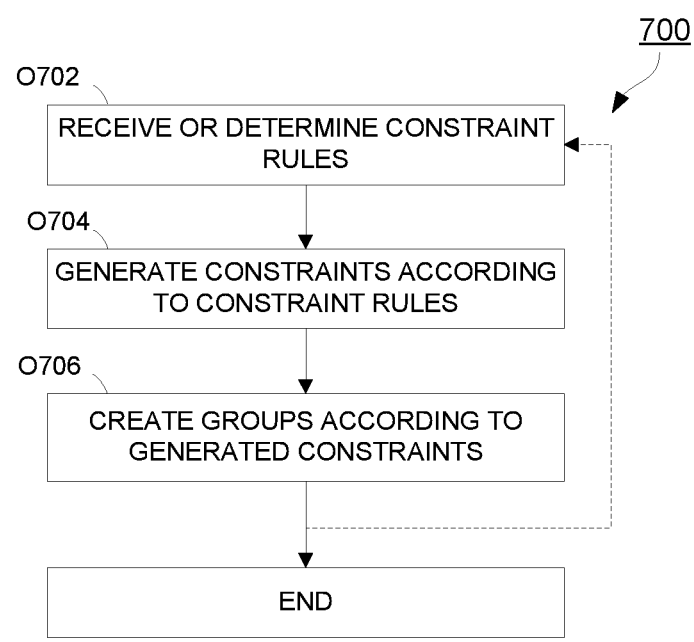
FIG. 7 illustrates a flowchart showing a process for generating constraints between geometric elements, clusters, and groups in accordance with disclosed embodiments.

FIG. 7 illustrates a flowchart showing a process 700 for generating constraints between geometric elements, clusters, and groups as disclosed herein. While different aspects of this process will be described with reference to the constraint generation tool 601 shown in FIG. 6, it should be appreciated that various implementations of this method may be performed without using the specific constraint generation tool 601. Similarly, constraint generation tool 601 may be used to implement alternate methods for assigning coloring arrangement to patterning clusters in layout design data.

Turning now to FIG. 7, in operation O702, the constraint generation tool receives or determines one or more constraint rules. In some embodiments, this is performed by a rules engine component 603 described herein. "Receiving," as used herein, can include loading from storage, receiving via an interaction with a user, receiving from another device or process, or otherwise. In specific embodiments, the one or more constraint rules can be received from a user via a graphical user interface or command-line interface to the computer system.

In some embodiments, instead of receiving the constraint rules, the constraint generation tool can generate a constraint rule from an input from a user. For example, if a user manually defines a constraint between two geometric elements, clusters, groups, or cells, the constraint generation tool can determine a corresponding rule. The constraint generation tool 601 can access layout design database 609 to determine or validate rules. As a specific example, in the context of the example of FIG. 4, if the constraint generation tool receives from a user a definition of a constraint between geometric element 413 and geometric element 415, the constraint generation tool can determine a rule that a constraint should be defined between every element in one cluster and each horizontally adjacent element in a different cluster. As another specific example, if the constraint generation tool receives from a user a definition of a constraint between geometric element 413 and geometric element 419, the constraint generation tool can determine a rule that a constraint should be defined between every element in one cluster and each vertically adjacent element that is not in that cluster. In some embodiments, the constraint generation tool, after automatically determining a rule or rules, can verify the rule with the user before it is applied.

Specifically, the constraint rules are much more sophisticated than simple distance-only rules, and so improve the functionality of the constraint generation tool and the computer system(s) on which it operates. Some non-limiting examples of constraint rules include:

Create a constraint between each adjacent (above, below, or to the side) geometric element in a cluster, group, or cell.

Create a constraint between each adjacent (above, below, or to the side) geometric element in different clusters, groups, or cells.

Create a constraint between a non-cluster (or non-group) geometric element and each adjacent (above, below, or to the side) non-cluster (or non-group) geometric element.

Create a constraint between a non-cluster geometric element (or non-group) and each adjacent (above, below, or to the side) geometric element that is in a cluster (or group).

Create a constraint between each bottom geometric element in a cluster, group, or cell and each top geometric element in an adjacent (above, below, or to the side) cluster, group, or cell.

Create a constraint between each geometric element in a cluster, group, or cell and its second neighbor in that cluster, group, or cell.

Create a constraint between each geometric element in a cluster, group, or cell that has a coloring marker and each geometric element in an adjacent (above, below, or to the side) cluster, group, or cell that has a coloring marker.

Each constraint rule defines a condition for which a constraint (a requirement that the two constrained elements have different "colors") should be generated. Constraint rules such as those disclosed herein are much more robust, versatile, and useful than conventional technique, which only support automatically creating a constraint between two geometric elements that are less than a specified distance apart.

In operation O704, the constraint generation tool generates constraints according to the one or more constraint rules. This operation can be performed on the entire design layout or only a portion of the design layout. This operation can include identifying each geometric element, cluster, and group, identifying each corresponding geometric element, cluster, and group as identified by the one or more constraint rules. This operation can include generating each constraint and storing it in the design layout database.

In operation O706, the constraint generation tool creates groups according to the newly-generated constraints. This operation can be performed on the entire design layout or only a portion of the design layout. This operation can include identifying each constraint generated between each pair of geometric elements, clusters, or group, and creating a new group between each of those pair. This operation can include generating each constraint and group storing it in the design layout database.

After operation O706, the constraint generation tool can return to operation O702 to receive or determine additional constraint rules and repeat the process. Alternately, if no more constraints are to be generated, the constraint generation tool can store all the constraints and groups in the layout design database so they can be used for coloring processes as described herein. In some cases, the groups are only used for one or more subsequent iterations of the process described above, and the group data can be discarded after the subsequent iteration or after the process is completed entirely. These constraints or groups can be later used in a lithographic process. The stored constraints can thereafter be transferred to or otherwise used by, for example, a multi-patterning tool, a tool that filters or manipulates the constraints, or otherwise.

When determining constraint rules or generating constraints, among other operations, it can be important for the computer system to be able to identify specific characteristics of the geometric elements in the hierarchical cells. For example, to apply a second-neighbor set of constraints in a chain of geometric elements or cells, the system must first identify the chains of geometric elements. A "chain" is a series of geometric elements (or cells) connected together so that the interior elements (that is, not on the ends) have only two connections—one connection to each of its neighbors. If an element has one connection or more than two connections, it can be the terminal end of a chain, but the chain cannot pass through it. The chain is therefore a series of elements in a cell with exactly two connections each plus terminal elements.

In a conventional system, to identify the chains of elements, the entire design layout must be analyzed one geometric element at a time, on each hierarchical level, which is a computationally intensive task that often takes days to complete.

As another example, before beginning a coloring process, the computer system generally determines an anchor cell or element, such as the lower-left or upper-left cell of the design layout. While the computer system can identify relative positions between different elements, it does not necessarily know which element is in, for example, the lower-left corner.

In a conventional system, to identify the lower-left element, the system must analyze each element in the entire layout in order to determine whether it is connected to any elements that are lower or more to the left than itself, and do the same for any other unconnected cells. Again, the entire design layout must be analyzed one geometric element at a time, on each hierarchical level, which is a computationally intensive task that often takes days to complete.

Disclosed embodiments include a process for identifying elements in the global layout by applying a local rule to cells in each layer of the hierarchy, removing any cells that do not meet the rule, and applying the local rule to the next higher layer of the hierarchy until each layer has been processed. By eliminating cells each time they do not meet the rule, not every cell needs to be processed. Further, each remaining cell in each layer can be processed in parallel, greatly improving processing speed. A process such as that disclosed below improves the functionality of the computer system by identifying elements in minutes rather than the literal days of processing required by conventional processes.

Using techniques as disclosed herein, the system can apply a "transformation" or other rule on each local level. While the example above uses the same local rule at each level, in other embodiments, it does not have to be the same transformation in every case, but could apply a different transformation for each geometry and each cell.

Figure 8:
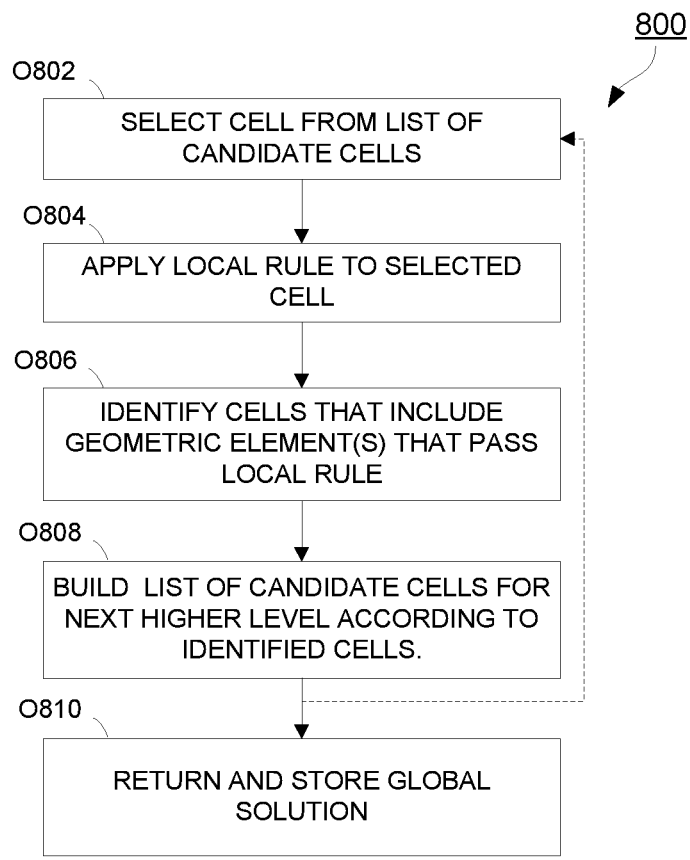
FIG. 8 illustrates a flowchart showing a process for identifying elements in a design layout according to a local rule in accordance with disclosed embodiments.

FIG. 8 illustrates a flowchart showing a process 800 for identifying elements in a design layout according to a local rule as disclosed herein. While different aspects of this process will be described with reference to the computer system and processors illustrated in FIGS. 1 and 2, it should be appreciated that various implementations of this method may be performed without using the specific computer system architecture.

Turning now to FIG. 8, in operation O802, the computer system selects a cell from a list of candidate cells for a level of the hierarchy. Note that this operation, and the following operations, can be performed in parallel for any number of cells. In an initial pass through this process, all of the cells on the level, typically the lowest level, can be treated as candidate cells.

In operation O804, the computer system applies a local rule to the selected cell.

As described herein, this can be a local rule, for example, to find a geometric element of the cell that is in a specific location, such as a bottom left corner or top left corner.

As an alternate example, this can be a local rule to identify a chain of geometric elements with interior elements with exactly two connections.

In operation O806, the computer system identifies the cell(s) that include geometric element(s) that pass the local rule. Of course, depending on the way the rule is stated (in positive or negative terms), this can be accomplished by an equivalent operation of identifying the cells that include geometric element(s) that fail the local rule, and such an equivalent is intended to be considered when referring to "passing" the local rule, below.

In operation O808, the computer system builds a list of candidate cells for the next higher level in the hierarchy based on the identified cell(s). This results in removing some cells as candidates for further analysis because they contain no elements that pass the local rule. For example, if a cell has no element that could possibly be in the specific location specified by the local rule, then that cell need is not included in the candidate cells for the next higher level. If a cell has at least one element that passes the local rule and so could be the element that is intended to be identified globally, then the cell is included in the candidate cells for the next higher level. This can be accomplished, for example, by only adding cells that pass the local rule to the list of candidate cells, or starting with a candidate list of all cells to be passed to the next higher level in the hierarchy and removing any cells that contain no elements that pass/fail the local rule.

If there is no higher level in the hierarchy, in operation O810, the system returns and stores the list of candidate cells as the global solution for the applied local rule, and can also return and store the specific geometric elements in the list of candidate cells that pass/fail the local rule. Otherwise, the computer system can return to operation O802 to repeat the application of the local rule to the candidate cells of the next higher level of the hierarchy.

CONCLUSION

While the technology disclosed herein has been described with respect to specific examples, including presently preferred modes, those skilled in the art will appreciate that there are numerous variations and permutations of the above described systems and techniques that fall within its spirit and scope as set forth in the appended claims. For example, while specific terminology has been employed above to refer to electronic design automation processes, it should be appreciated that various examples of the technology may be implemented using any desired combination of electronic design automation processes.

Other related techniques and processes are described in United States Patent Publication 2017/0242953, which is hereby incorporated by reference.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor," or "controller," within a claim is understood and intended to refer to structures known to those skilled in the relevant art, as further modified or enhanced by the features of the claims themselves, and is not intended to invoke 35 U.S.C. § 112(f).

The invention claimed is:

1. A method of identifying elements in a design layout having multiple levels of hierarchical cells, each cell having one or more geometric elements, comprising:
   selecting a cell from a list of candidate cells for a level of a hierarchy;
   applying a local rule to the selected cell wherein the local rule comprises a rule to find a geometric element of the cell that is in a specific location;
   identifying each selected cell that includes a geometric element that passes the local rule; and
   building a list of candidate cells for a next-higher level of the hierarchy that comprises the identified cells;
   repeating the selecting, identifying, and building operations for each higher level of the hierarchy; and
   when a highest level of the hierarchy has been processed, returning and storing the list of candidate cells as a global solution for the applied local rule.

2. The method of claim 1, wherein the selecting, identifying, and building operations are performed in parallel for multiple cells from the list of candidate cells for the level of the hierarchy.

3. The method of claim 1, further comprising returning and storing the geometric elements in the list of candidate cells that pass the local rule.

4. A computer system comprising:

a processor; and a non-transitory machine-readable medium comprising instructions that, when executed by the processor, cause the computing system to identify elements in a design layout having multiple levels of hierarchical cells, each cell having one or more geometric elements, including by:

selecting a cell from a list of candidate cells for a level of a hierarchy;

applying a local rule to the selected cell, wherein the local rule comprises a rule to identify a chain of geometric elements;

identifying each selected cell that includes a geometric element that passes the local rule; and building a list of candidate cells for a next-higher level of the hierarchy that comprises the identified cells;

repeating the selecting, identifying, and building operations for each higher level of the hierarchy; and when a highest level of the hierarchy has been processed, returning and storing the list of candidate cells as a global solution for the applied local rule.

5. The computer system of claim 4, wherein the instructions, when executed by the processor, cause the computer system to select a cell, identify each selected cell, and build the list of candidate cells in parallel for multiple cells from the list of candidate cells for the level of the hierarchy.

6. The computer system of claim 4, wherein the instructions, when executed by the processor, further cause the computer system to identify the elements in the design layout by returning and storing the geometric elements in the list of candidate cells that pass the local rule.

7. A non-transitory machine-readable medium comprising instructions that, when executed by a processor, cause a computing system to identify elements in a design layout having multiple levels of hierarchical cells, each cell having one or more geometric elements, including by:

selecting a cell from a list of candidate cells for a level of a hierarchy;

applying a local rule to the selected cell, wherein the local rule comprises a rule to find a geometric element of the cell that is in a specific location;

identifying each selected cell that includes a geometric element that passes the local rule; and building a list of candidate cells for a next-higher level of the hierarchy that comprises the identified cells;

repeating the selecting, identifying, and building operations for each higher level of the hierarchy; and when a highest level of the hierarchy has been processed, returning and storing the list of candidate cells as a global solution for the applied local rule.

8. The non-transitory machine-readable medium of claim 7, wherein the instructions, when executed by the processor, cause the computing system to select a cell, identify each selected cell, and build the list of candidate cells in parallel for multiple cells from the list of candidate cells for the level of the hierarchy.

9. The non-transitory machine-readable medium of claim 7, wherein the instructions, when executed by the processor, further cause the computing system to identify the elements in the design layout by returning and storing the geometric elements in the list of candidate cells that pass the local rule.

* * * * *